(12) United States Patent
Duxbury et al.

(10) Patent No.: US 7,069,646 B2
(45) Date of Patent: Jul. 4, 2006

(54) TECHNIQUES FOR REDUCING THE NUMBER OF LAYERS IN A MULTILAYER SIGNAL ROUTING DEVICE

(75) Inventors: Guy M. A. F. Duxbury, Nepean (CA); Aneta Wyrzykowska, Kanata (CA); Luigi G. Difilippo, Kanata (CA); Herman Kwong, Kanata (CA)

(73) Assignee: Nortel Networks Limited, St. Laurent (CA)

(*) Notice: Subject to any disclaimer, the term of this patent is extended or adjusted under 35 U.S.C. 154(b) by 228 days.

(21) Appl. No.: 10/407,460

(22) Filed: Apr. 7, 2003

(65) Prior Publication Data

US 2004/0136168 A1 Jul. 15, 2004

Related U.S. Application Data

(63) Continuation-in-part of application No. 10/126,700, filed on Apr. 22, 2002, now Pat. No. 6,545,876, which is a continuation of application No. 09/651,188, filed on Aug. 30, 2000, now Pat. No. 6,388,890, application No. 10/407,460, which is a continuation-in-part of application No. 10/101,211, filed on Mar. 20, 2002, which is a continuation-in-part of application No. 09/651,188, filed on Aug. 30, 2000, now Pat. No. 6,388,890, application No. 10/407,460, which is a continuation-in-part of application No. 10/326,123, filed on Dec. 23, 2002, which is a continuation-in-part of application No. 10/126,700, filed on Apr. 22, 2002, (Continued)

(60) Provisional application No. 60/212,387, filed on Jun. 19, 2000.

(51) Int. Cl.
*H05K 3/36* (2006.01)

(52) U.S. Cl. ............... 29/830; 29/600; 29/825; 29/846; 29/852; 174/261; 174/262

(58) Field of Classification Search ............... 29/825, 29/830, 846, 852, 600; 174/261, 262
See application file for complete search history.

(56) References Cited

U.S. PATENT DOCUMENTS 5,006,820 A 4/1991 Prioste et al. ............ 333/246

(Continued)

FOREIGN PATENT DOCUMENTS

EP 1087440 A2 3/2001
FR 2782230 A1 2/2000

OTHER PUBLICATIONS

European Search Report dated Jun. 8, 2004 for Application No. EP 03 39 4085.

(Continued)

*Primary Examiner*—Carl J. Arbes
(74) *Attorney, Agent, or Firm*—Hunton & Williams LLP

(57) ABSTRACT

Techniques for reducing the number of layers in a multilayer signal routing device are disclosed. In one particular exemplary embodiment, the techniques may be realized as a method wherein the multilayer signal routing device has a plurality of electrically conductive signal path layers for routing a plurality of electrical signals thereon. The method may comprise forming a plurality of electrically conductive vias in the multilayer signal routing device for electrically connecting at least two of the plurality of electrically conductive signal path layers, wherein the plurality of vias are arranged so as to form at least one channel in at least one other of the plurality of electrically conductive signal path layers. The method may also comprise grouping at least a portion of the plurality of electrical signals based at least in part upon their proximity to the at least one channel so that they may be efficiently routed therein.

20 Claims, 14 Drawing Sheets

Related U.S. Application Data now Pat. No. 6,545,876, and a continuation-in-part of application No. 10/101,211, filed on Mar. 20, 2002, application No. 10/407,460, which is a continuation-in-part of application No. 10/326,079, filed on Dec. 23, 2002, which is a continuation-in-part of application No. 10/126,700, filed on Apr. 22, 2002, now Pat. No. 6,545,876, and a continuation-in-part of application No. 10/101,211, filed on Mar. 20, 2002.

U.S. PATENT DOCUMENTS

| Patent No. | | Date | Inventor | Class |
|---|---|---|---|---|
| 5,191,174 | A * | 3/1993 | Chang et al. | 174/266 |
| 5,281,151 | A * | 1/1994 | Arima et al. | 439/68 |
| 5,451,721 | A | 9/1995 | Tsukada et al. | 174/261 |
| 5,544,018 | A | 8/1996 | Sommerfeldt et al. | 361/792 |
| 5,686,764 | A | 11/1997 | Fulcher | 257/200 |
| 5,743,004 | A * | 4/1998 | Chobot et al. | 29/830 |
| 5,784,262 | A | 7/1998 | Sherman | |
| 5,847,936 | A | 12/1998 | Forehand et al. | |
| 5,855,995 | A * | 1/1999 | Haq et al. | 428/210 |
| 6,014,507 | A * | 1/2000 | Fujii | 716/12 |
| 6,021,564 | A * | 2/2000 | Hanson | 29/852 |
| 6,181,004 | B1 | 1/2001 | Koontz et al. | |
| 6,194,668 | B1 | 2/2001 | Horiuchi et al. | 174/261 |
| 6,198,635 | B1 | 3/2001 | Shenoy et al. | 361/760 |
| 6,232,564 | B1 | 5/2001 | Arndt et al. | |
| 6,256,769 | B1 | 7/2001 | Tamarkin et al. | |
| 6,271,478 | B1 | 8/2001 | Horiuchi et al. | 174/255 |
| 6,310,398 | B1 | 10/2001 | Katz | 257/773 |
| 6,335,493 | B1 | 1/2002 | Horiuchi et al. | 174/260 |
| 6,384,341 | B1 * | 5/2002 | Rothermel et al. | 174/255 |
| 6,388,890 | B1 * | 5/2002 | Kwong et al. | 361/780 |
| 6,407,343 | B1 * | 6/2002 | Tanaka | 174/261 |
| 6,452,262 | B1 | 9/2002 | Juneja | 257/691 |
| 6,521,846 | B1 | 2/2003 | Freda et al. | 174/260 |
| 6,538,213 | B1 * | 3/2003 | Carden et al. | 174/262 |
| 6,545,876 | B1 * | 4/2003 | Kwong et al. | 361/780 |
| 6,812,803 | B1 * | 11/2004 | Goergen | 333/1 |
| 2003/0043560 | A1 | 3/2003 | Clarkson et al. | |

OTHER PUBLICATIONS

European Search Report dated Jun. 8, 2004 for Application No. EP 03 39 4028.

* cited by examiner

TECHNIQUES FOR REDUCING THE NUMBER OF LAYERS IN A MULTILAYER SIGNAL ROUTING DEVICE

CROSS-REFERENCE TO RELATED APPLICATIONS

This patent application is a continuation-in-part patent application of U.S. patent application Ser. No. 10/126,700, filed Apr. 22, 2002 now U.S. Pat. No. 6,545,876, which is a continuation patent application of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000, all of which are hereby incorporated by reference herein in their entirety.

This patent application is also a continuation-in-part patent application of U.S. patent application Ser. No. 10/101,211, filed Mar. 20, 2002, which is a continuation-in-part patent application of the above-referenced U.S. patent application Ser. No. 09/651,188, filed Aug. 30, 2000, now U.S. Pat. No. 6,388,890, all of which are hereby incorporated by reference herein in their entirety.

This patent application is also a continuation-in-part patent application of U.S. patent application Ser. No. 10/326,123, filed Dec. 23, 2002, which is a continuation-in-part patent application of the above-referenced U.S. patent application Ser. No. 10/126,700, filed Apr. 22, 2002 now U.S. Pat. No. 6,545,876, and a continuation-in-part patent application of the above-referenced U.S. patent application Ser. No. 10/101,211, filed Mar. 20, 2002, all of which are hereby incorporated by reference herein in their entirety.

This patent application is also a continuation-in-part patent application of U.S. patent application Ser. No. 10/326,079, filed Dec. 23, 2002, which is a continuation-in-part patent application of the above-referenced U.S. patent application Ser. No. 10/126,700, filed Apr. 22, 2002 now U.S. Pat. No. 6,545,876, and a continuation-in-part patent application of the above-referenced U.S. patent application Ser. No. 10/101,211, filed Mar. 20, 2002, all of which are hereby incorporated by reference herein in their entirety.

FIELD OF THE INVENTION

The present invention relates generally to multilayer signal routing devices and, more particularly, to techniques for reducing the number of layers in a multilayer signal routing device.

BACKGROUND OF THE INVENTION

The making of electrical connections between electronic components has long been accomplished using printed circuit boards. The first such circuit boards had only a single signal layer on a top surface thereof for routing electrical signals between electronic components mounted thereon. These single signal layer circuit boards have severe limitations with regard to the number of electrical signals that can be routed between electronic components mounted on the same circuit board. That is, the number of electrical signals that can be routed between electronic components mounted on a single signal layer circuit board is limited by the amount of area on the single signal layer.

The area limitations associated with single signal layer circuit boards led to the development of multilayer printed circuit boards. Such multilayer printed circuit boards may be either single or double-sided and may have multiple signal layers on the surface of and buried within the multilayer printed circuit boards. Thus, such multilayer printed circuit boards have allowed a large increase in the number of electrical signals that may be routed between electronic components mounted on the same circuit board.

The use of multilayer printed circuit boards has been particularly beneficial when using electronic components having high density packages. That is, electronic components having high density packages generally require multiple layers of a multilayer printed circuit board to make electrical connections with other electronic components mounted on the same circuit board. In fact, the density of electronic component packages typically dictates the number of layers that must be provided by the multilayer printed circuit board upon which the electronic component is mounted. While the number of layers that may be provided by a multilayer printed circuit board is theoretically unlimited, problems occur when the number of layers in a multilayer printed circuit board exceeds a reasonable number, particularly when trying to route high speed electrical signals between electronic components. For example, when making electrical connections between different layers in multilayer printed circuit boards, electrically conductive vias are generally used. While these electrically conductive vias allow direct vertical electrical connections to be made between different layers within a multilayer printed circuit board, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. In addition, these intrinsic parasitics can also have an adverse effect on the manufacturability of a printed circuit board and thus the cost thereof. Because of their adverse affect on signal performance, these intrinsic parasitics can also limit the bandwidth of signals propagating along each electrically conductive via. These adverse affects only increase as the number of layers in a multilayer printed circuit board increase.

In view of the foregoing, it would be desirable to provide a technique for increasing the number of electrical connections that may be made between electronic components mounted on a multilayer printed circuit board without increasing the number of layers in the multilayer printed circuit board. More particularly, it would be desirable to provide a technique for reducing the number of layers in a multilayer signal routing device in an efficient and cost effective manner.

SUMMARY OF THE INVENTION

According to the present invention, techniques for reducing the number of layers in a multilayer signal routing device are provided. In one particular exemplary embodiment, the techniques may be realized as a method for reducing the number of layers in a multilayer signal routing device having a plurality of electrically conductive signal path layers for routing a plurality of electrical signals thereon. Such a method may comprise forming a plurality of electrically conductive vias in the multilayer signal routing device for electrically connecting at least two of the plurality of electrically conductive signal path layers, wherein the plurality of electrically conductive vias are arranged so as to form at least one channel in at least one other of the plurality of electrically conductive signal path layers. Such a method may also comprise grouping at least a portion of the plurality of electrical signals based at least in part upon their proximity to the at least one channel so that they may be efficiently routed therein.

In accordance with other aspects of this particular exemplary embodiment of the present invention, at least three of the plurality of electrically conductive vias are arranged to form each of the at least one channel. Also, the at least one channel corresponds in shape to the arrangement of the plurality of electrically conductive vias. Further, the at least one other of the plurality of electrically conductive signal path layers is not located between the at least two electrically connected electrically conductive signal path layers.

In accordance with further aspects of this particular exemplary embodiment of the present invention, the plurality of electrically conductive vias may beneficially form a part of an array of a plurality of electrically conductive contacts, wherein at least some of the plurality of electrically conductive contacts are respectively associated with at least some of the plurality of electrical signals, and wherein electrical signals that are respectively associated with electrically conductive contacts located along a perimeter of the array are not routed in the at least one channel. If such is the case, the method may further beneficially comprise calculating an optimum number of the at least one channel based upon: a number of electrically conductive signal paths that fit between electrically conductive contacts; a number of electrically conductive signal paths that fit within the at least one channel; a number of electrical signals that are respectively associated with electrically conductive contacts located along the perimeter of the array that are not routed in the at least one channel; and/or a number of electrically conductive contacts located along the perimeter of the array that are respectively associated with electrical signals that are not routed in the at least one channel.

Also, the method may further beneficially comprise subgrouping at least a portion of the grouped plurality of electrical signals based at least in part upon their proximity to the perimeter of the array. If such is the case, the method may then further beneficially comprise routing subgroups of electrical signals located furthest from the perimeter of the array in the at least one channel, and routing subgroups of electrical signals located closest to the perimeter of the array in the at least one channel only after subgroups of electrical signals located furthest from the perimeter of the array have been routed. Alternatively, the method may further beneficially comprise routing subgroups of electrical signals located closest to the perimeter of the array outside the at least one channel. Alternatively still, the method may further beneficially comprise pairing subgroups of electrical signals located closer to the perimeter of the array with subgroups of electrical signals located further from the perimeter of the array so as to improve routing efficiency.

Further, the at least one channel may beneficially be at least partially substantially diamond-shaped so as to allow electrical signals to be routed around electrically conductive contacts disposed within a center portion of the diamond shape. If such is the case, the method may further beneficially comprise shifting the locations of the electrically conductive contacts disposed within the center portion of the diamond shape so as to allow additional electrical signals to be routed around the electrically conductive contacts disposed within the center portion of the diamond shape.

Additionally, the at least one channel may beneficially include a center channel formed substantially through a center of the array. If such is the case, the center channel may beneficially be located substantially through the center of the array based upon: a number of electrical signals identified as differential signal pairs that may span the center channel; even distribution of electrical signal routing within the center channel; even distribution of electrical signal routing within others of the at least one channel; even distribution of electrical signal routing outside the center channel; and/or even distribution of electrical signal routing outside others of the at least one channel.

Additionally still, the method may further beneficially comprise forming a separate channel substantially through a center of the array, wherein the separate channel is located substantially through the center of the array based upon: a number of electrical signals identified as differential signal pairs that may span the separate channel; even distribution of electrical signal routing within the separate channel; even distribution of electrical signal routing within the at least one channel; even distribution of electrical signal routing outside the separate channel; and/or even distribution of electrical signal routing outside the at least one channel.

In accordance with still further aspects of this particular exemplary embodiment of the present invention, the method may further beneficially comprise forming at least one additional electrically conductive via in the multilayer signal routing device for electrically connecting at least two power/ground layers of the multilayer signal routing device, wherein the at least one additional electrically conductive via may beneficially be arranged so as to form at least one additional channel in at least one other of the plurality of electrically conductive signal path layers.

In accordance with additional aspects of this particular exemplary embodiment of the present invention, the method may further beneficially comprise forming at least one additional electrically conductive via in the multilayer signal routing device for electrically connecting at least two power/ground layers of the multilayer signal routing device, wherein the at least one additional electrically conductive via may beneficially be arranged so as to extend the at least one channel in at least one other of the plurality of electrically conductive signal path layers.

In another particular exemplary embodiment, the techniques may be realized as an alternative method for reducing the number of layers in a multilayer signal routing device having a plurality of electrically conductive signal path layers for routing a plurality of electrical signals thereon. Such a method may comprise forming a plurality of electrically conductive contacts on a first of the plurality of electrically conductive signal path layers, wherein at least a portion of the plurality of electrically conductive pads are arranged so as to form at least one channel in at least one other of the plurality of electrically conductive signal path layers. Such a method may also comprise routing at least a portion of the plurality of electrical signals to or from at least some of the arranged plurality of electrically conductive pads on the first of the plurality of electrically conductive signal path layers.

In accordance with other aspects of this particular exemplary embodiment of the present invention, at least three of the arranged plurality of electrically conductive pads are arranged to form each of the at least one channel.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a more full understanding of the present invention, reference is now made to the appended drawings. These drawings should not be construed as limiting the present invention, but are intended to be exemplary only.

DETAILED DESCRIPTION OF EXEMPLARY EMBODIMENT(S)

At the outset, it is helpful to refer to the microvia-based techniques for reducing the number of layers in a multilayer signal routing device and the power/ground-based techniques for reducing the number of layers in a multilayer signal routing device as have been substantially described in the above-referenced U.S. Provisional Patent Application No. 60/212,387, the above-referenced U.S. patent application Ser. No. 09/651,188 (now U.S. Pat. No. 6,388,890), the above-referenced U.S. patent application Ser. No. 10/101,211, the above-referenced U.S. patent application Ser. No. 10/126,700, the above-referenced U.S. patent application Ser. No. 10/326,123, and the above-referenced U.S. patent application Ser. No. 10/326,079, all of which have been incorporated by reference herein in their entirety.

The above-referenced microvia-based and power/ground-based techniques are certainly beneficial for reducing the number of layers in a multilayer signal routing device. However, these techniques may be even more beneficial if used in conjunction with one or more of the several techniques described herein. It should be noted, however, that the techniques described herein may also be used separately to reduce the number of layers in a multilayer signal routing device in an efficient and cost effective manner.

Figure 1:
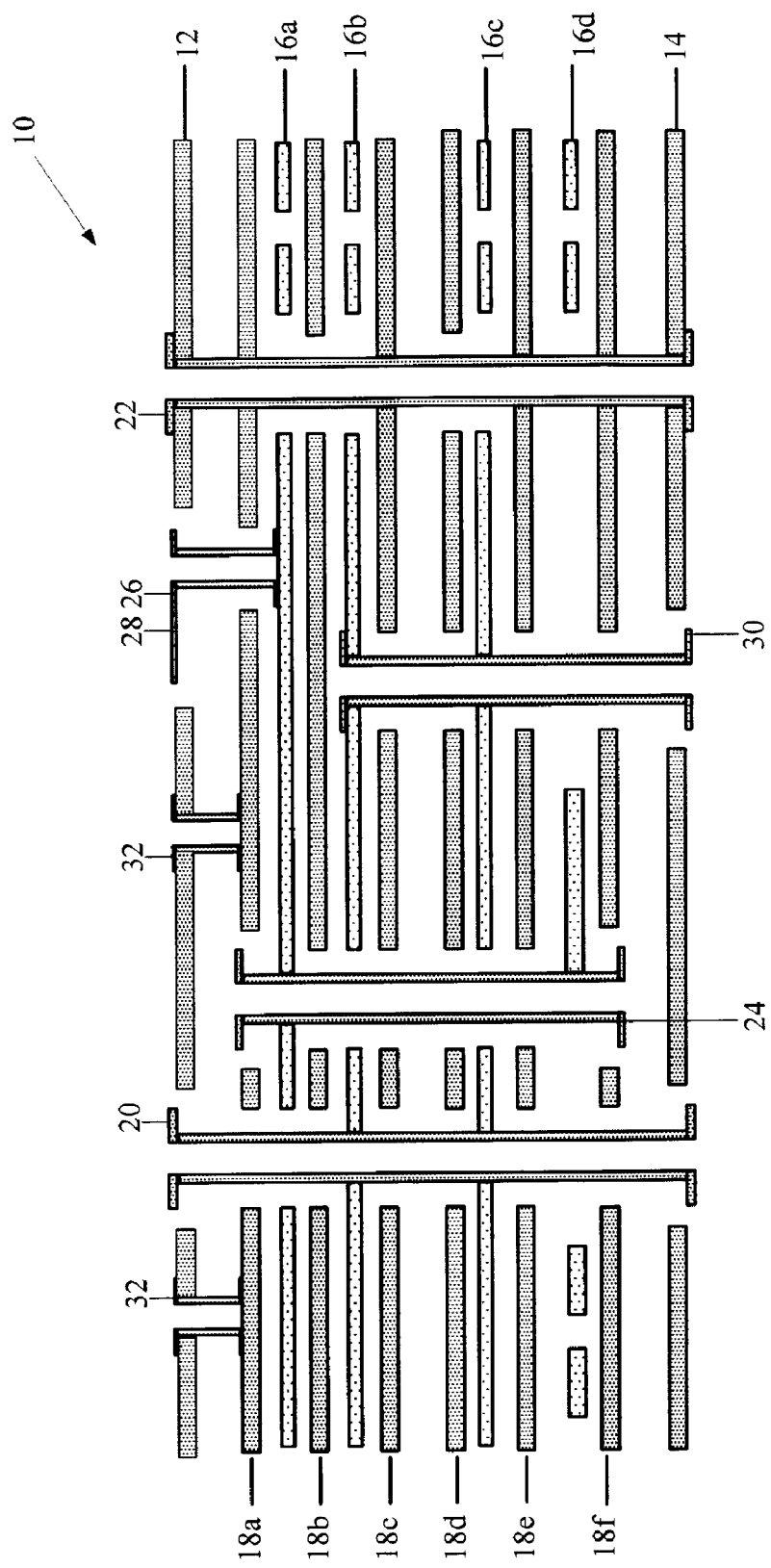
FIG. 1 shows a side cross-sectional view of a multilayer signal routing device in accordance with the present invention.

Referring to FIG. 1, there is shown a side cross-sectional view of a multilayer signal routing device 10 in accordance with the present invention. That is, the multilayer signal routing device 10 incorporates the concepts of the present invention so as to reduce the number of layers in the multilayer signal routing device 10.

The multilayer signal routing device 10 comprises a primary (top) layer 12, a secondary (bottom) layer 14, a plurality of electrically conductive signal path layers 16, and a plurality of power/ground plane layers 18. It should be noted that the primary layer 12 and the secondary layer 14 are primarily power/ground plane layers except for electrically conductive contacts and test signal runs formed thereon, as will be described in more detail below. It should also be noted that electronic components may be mounted on either (single-sided signal routing device) or both (double-sided signal routing device) the primary layer 12 and the secondary layer 14.

The multilayer signal routing device 10 also comprises a first supervia 20 for electrically connecting selected ones of the plurality of signal layers 16 (i.e., signal layers 16b and 16c), a second supervia 22 for electrically connecting the primary layer 12, the secondary layer 14, and selected ones of the plurality of power/ground plane layers 18 (i.e., power/ground plane layers 18a, 18c, 18e, and 18f), a buried via 24 for electrically connecting selected ones of the plurality of signal layers 16 (i.e., signal layers 16a and 16d), a signal microvia 26 for electrically connecting signal layer 16a to an electrically conductive contact 28 formed on the primary layer 12, a blind via 30 for electrically connecting selected ones of the plurality of signal layers 16 (i.e., signal layers 16b and 16c), and a pair of power/ground microvias 32 for electrically connecting the primary layer 12 to power/ground plane layer 18a.

It should be noted that the buried via 24 and blind via 30 may alternatively be used to electrically connect selected ones of the plurality of power/ground plane layers 18. It should also be noted that the microvias 26 and 32 may also be via-in-pads or some other similar non-through-hole vias, that the microvias 26 and 32 may electrically connect other layers (i.e., secondary layer 14, signal layers 16, and power/ground layers 18) of the multilayer signal routing device 10, and that the microvias 26 and 32 may be electrically connected to other microvias, supervias, buried vias, blind vias, etc., either directly or through electrical connections formed on any of the layers (i.e., primary layer 12, secondary layer 14, signal layers 16, and power/ground layers 18) of the multilayer signal routing device 10. It should further be noted that it is the microvias 26 and 32 (or substantial equivalents thereof) which allow a substantial portion of the present invention techniques to be realized, as will now be described in more detail with reference to FIGS. 2–13.

Figure 2:
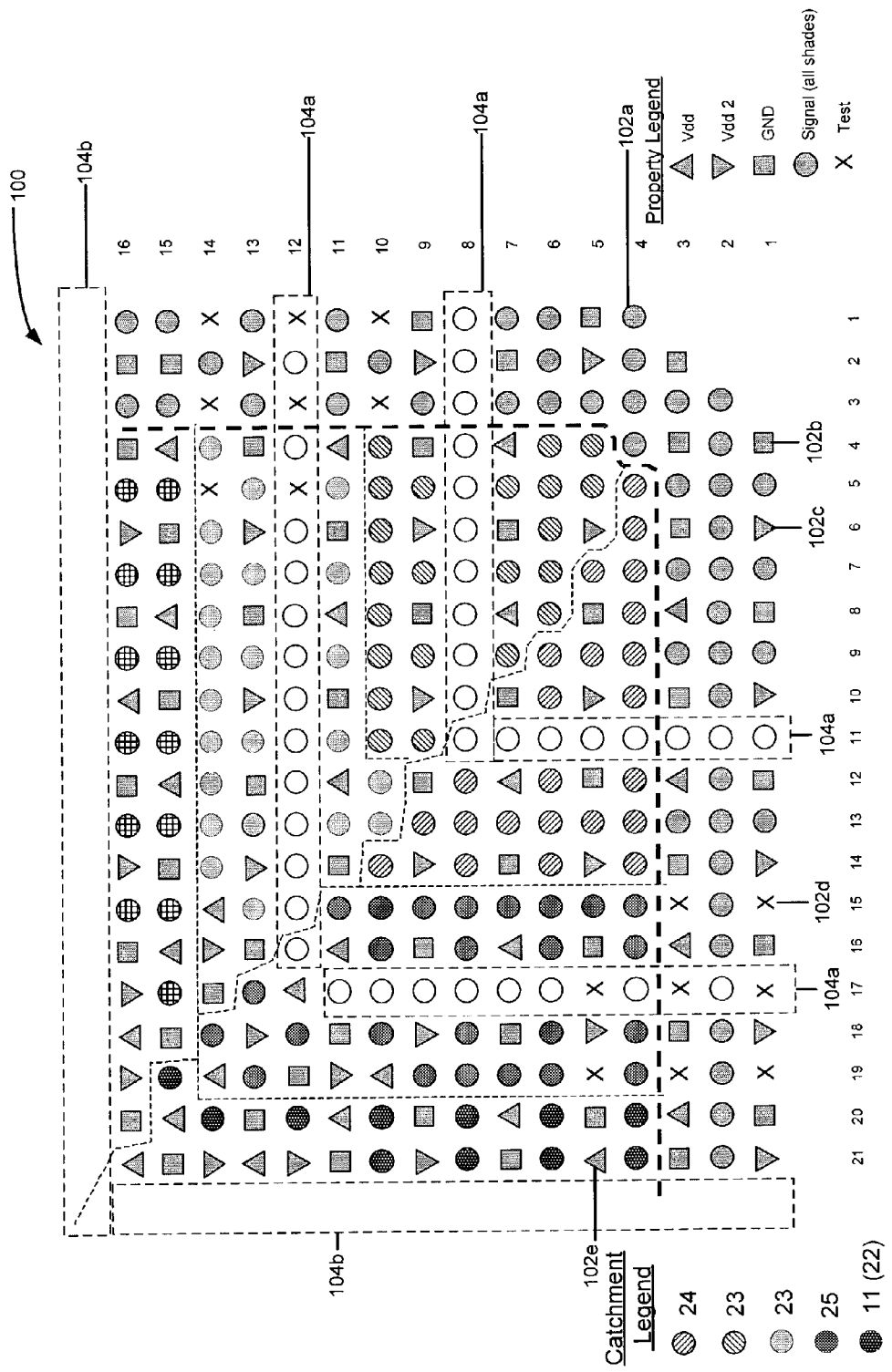
FIG. 2 shows a portion of a primary layer of the multilayer signal routing device shown in FIG. 1.

Referring to FIG. 2, there is shown a portion 100 of the primary layer 12 of the multilayer signal routing device 10 shown in FIG. 1. That is, the portion 100 shown in FIG. 2 corresponds to a portion of the primary layer 12 of the multilayer signal routing device 10 where one quadrant of an electronic component having a surface mount grid array package with 1247 electrically conductive contacts is mounted on the primary layer 12 of the multilayer signal routing device 10. For purposes of more fully understanding the present invention, assume column 1 and row 1 as shown in FIG. 2 correspond to an outer column and row, respectively, of the overall grid array package of the electronic component, while column 21 and row 16 as shown in FIG. 2 correspond to an inner column and row, respectively, of the overall grid array package of the electronic component.

The portion 100 comprises an array of electrically conductive contacts 102, which may be electrically connected with respective ones of the electrically conductive contacts of the electronic component. The portion 100 also comprises outlines for a plurality of channels 104 that may be formed in other layers (i.e., signal layers 16, power/ground layers 18, and secondary layer 14) of the multilayer signal routing device 10 using channel formation techniques as described in one or more of the above-referenced related patent applications. For example, channels 104a may be formed using the microvia-based techniques as described in the above-referenced related patent applications, while channels 104b may be formed using the microvia-based techniques, power/ground-based techniques, and/or dog-bone techniques as described in the above-referenced related patent applications.

At this point it should be noted that channels 104a are shown with electrically conductive contacts 102 formed therein. These electrically conductive contacts 102 within channels 104a represent microvias that are used to enable the formation of the channels 104a using the microvia-based techniques as described in the above-referenced related patent applications. At least three of the electrically conductive contacts 102 may be arranged to form each of the at least one channel.

It should also be noted that channels 104b are shown without any electrically conductive contacts formed therein. The absence of electrically conductive contacts within channels 104b indicate that the channels 104b may be formed using the microvia-based techniques, power/ground-based techniques, and/or dog-bone techniques as described in the above-referenced related patent applications.

As shown in FIG. 2, each of the electrically conductive contacts 102 may have one of several different types of electrical properties (e.g., Signal, Ground (GND), Power (Vdd, Vdd2), or Test), as defined in the electrical property legend. As also shown in FIG. 2, each of the electrically conductive contacts 102 having a Signal electrical property is grouped into one of several catchments as indicated by the shading of those electrically conductive contacts 102. Each catchment is formed to indicate which channel 104 may be used to route signals to and from electrically conductive contacts 102 within that catchment. For example, the 24 electrically conductive contacts 102 having descending (as viewed from left to right) diagonal line shading are all part of the catchment which may use the channel 104a formed in column 11, rows 1–8 to route signals to and from those 24 electrically conductive contacts 102. Similarly, the 23 electrically conductive contacts 102 having ascending (as viewed from left to right) diagonal line shading are all part of the catchment which may use the channel 104a formed in row 8, columns 1–11 to route signals to and from those 23 electrically conductive contacts 102. Similarly still, the 23 electrically conductive contacts 102 having light gray shading are all part of the catchment which may use the channel 104a formed in row 12, columns 1–16 to route signals to and from those 23 electrically conductive contacts 102. Similarly even still, the 25 electrically conductive contacts 102 having the light honeycomb shading pattern are all part of the catchment which may use the channel 104a formed in column 17, rows 1–11 to route signals to and from those 25 electrically conductive contacts 102.

At this point it should be noted that the 13 electrically conductive contacts 102 having the combined vertical and horizontal line shading are all part of the catchment which may use the channel 104b formed alongside row 16 to route signals to and from those 13 electrically conductive contacts 102. It is assumed that there are 13 additional electrically conductive contacts (not shown) formed in an adjacent quadrant (not shown) which may also use the channel 104b formed alongside row 16 to route signals to and from those 13 additional electrically conductive contacts. Similarly, it should be noted that the 11 electrically conductive contacts 102 having the dark honeycomb shading pattern are all part of the catchment which may use the channel 104b formed alongside column 21 to route signals to and from those 11 electrically conductive contacts 102. It is assumed that there are 11 additional electrically conductive contacts (not shown) formed in an adjacent quadrant (not shown) which may also use the channel 104b formed alongside column 21 to route signals to and from those 11 additional electrically conductive contacts. In view of the foregoing, the numbers in parenthesis in the catchment legend correspond to the assumed total number of electrically conductive contacts that are part of the catchments which may use the channels 104b formed alongside row 16 and alongside column 21.

As further shown in FIG. 2, all of the electrically conductive contacts 102 having dark gray shading in the outer three rows/columns are not part of any catchment. That is, since it is typically fairly straightforward to route signals to and from these electrically conductive contacts 102 without the use of a channel 104, these electrically conductive contacts 102 need not be part of any catchment.

At this point it should be noted that, while the outer three rows/columns are shown in FIG. 2 as not being part of any catchment, the number of outer rows/columns that need not be part of any catchment may increase up to the outer five rows/columns depending on the number of signals within those outer rows/columns that require routing.

At this point it should be noted that, for purposes of reader clarity, all of the catchments and the outer three rows/columns shown in FIG. 2 are separated by dashed line borders as shown in FIG. 2. The dashed line borders separating the catchments may be thought of as ridges and the channels 104 may be thought of as rivers, whereby signals are routed from electrically conductive contacts 102 using catchment channels 104 in a manner similar to water flowing from ridges into rivers.

Figure 3:
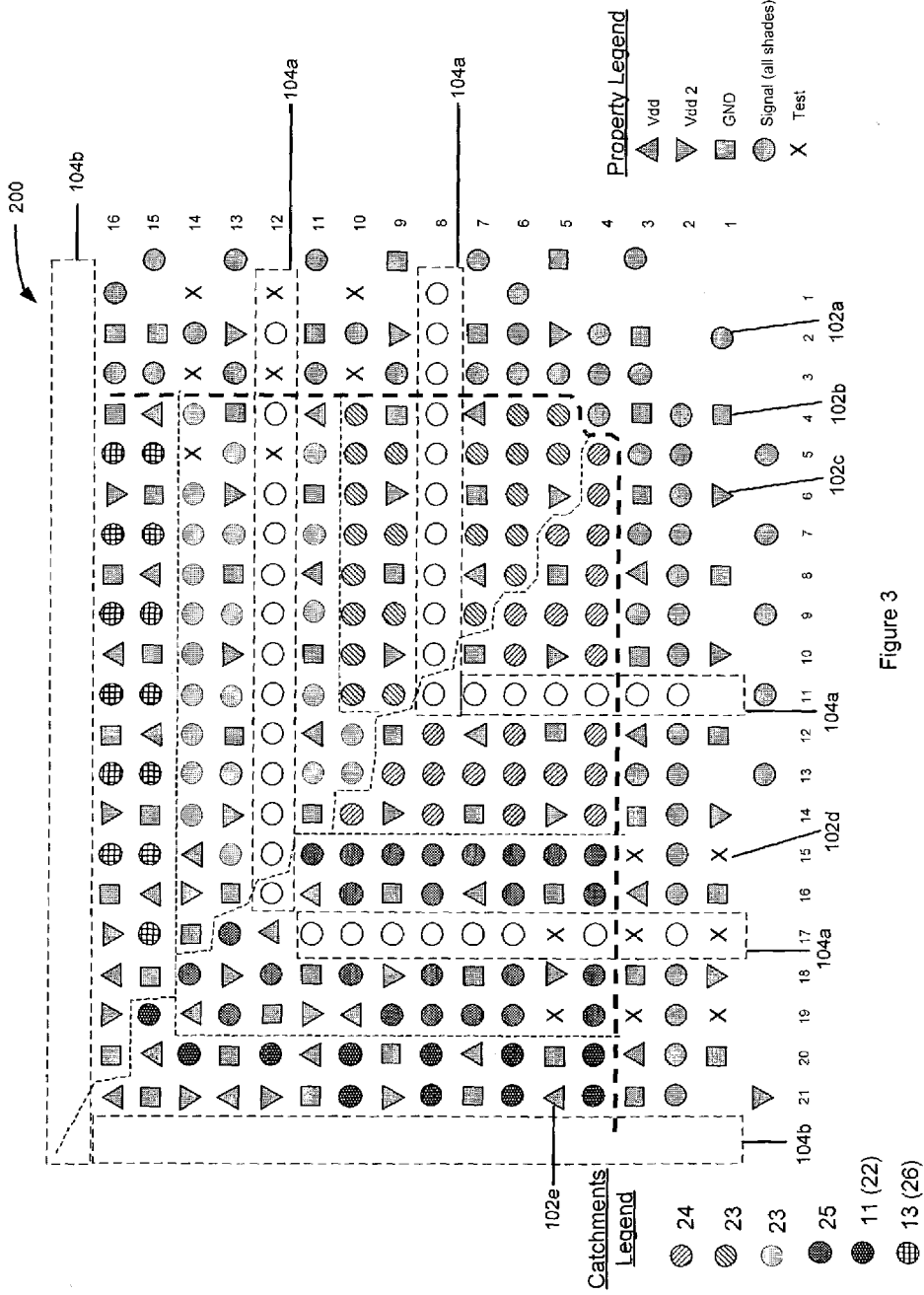
FIG. 3 shows an alternate embodiment of a portion of the primary layer of the multilayer signal routing device shown in FIG. 1.

Referring to FIG. 3, there is shown an alternate embodiment of a portion 200 of the primary layer 12 of the multilayer signal routing device 10 shown in FIG. 1. The alternate embodiment portion 200 shown in FIG. 3 is identical to the portion 100 shown in FIG. 2, except that the outermost row/column of the electrically conductive contacts 102 is staggered so as to provide greater access to the electrically conductive contacts 102 in the outer three rows/columns of the electrically conductive contacts 102 and thereby insure that signals may indeed be easily routed to and from these electrically conductive contacts 102 without the use of a channel 104. The staggering of the outermost row/column of the electrically conductive contacts 102 may be accomplished using the microvia-based techniques and/or power/ground-based techniques as described in the above-referenced related patent applications.

Figure 4:
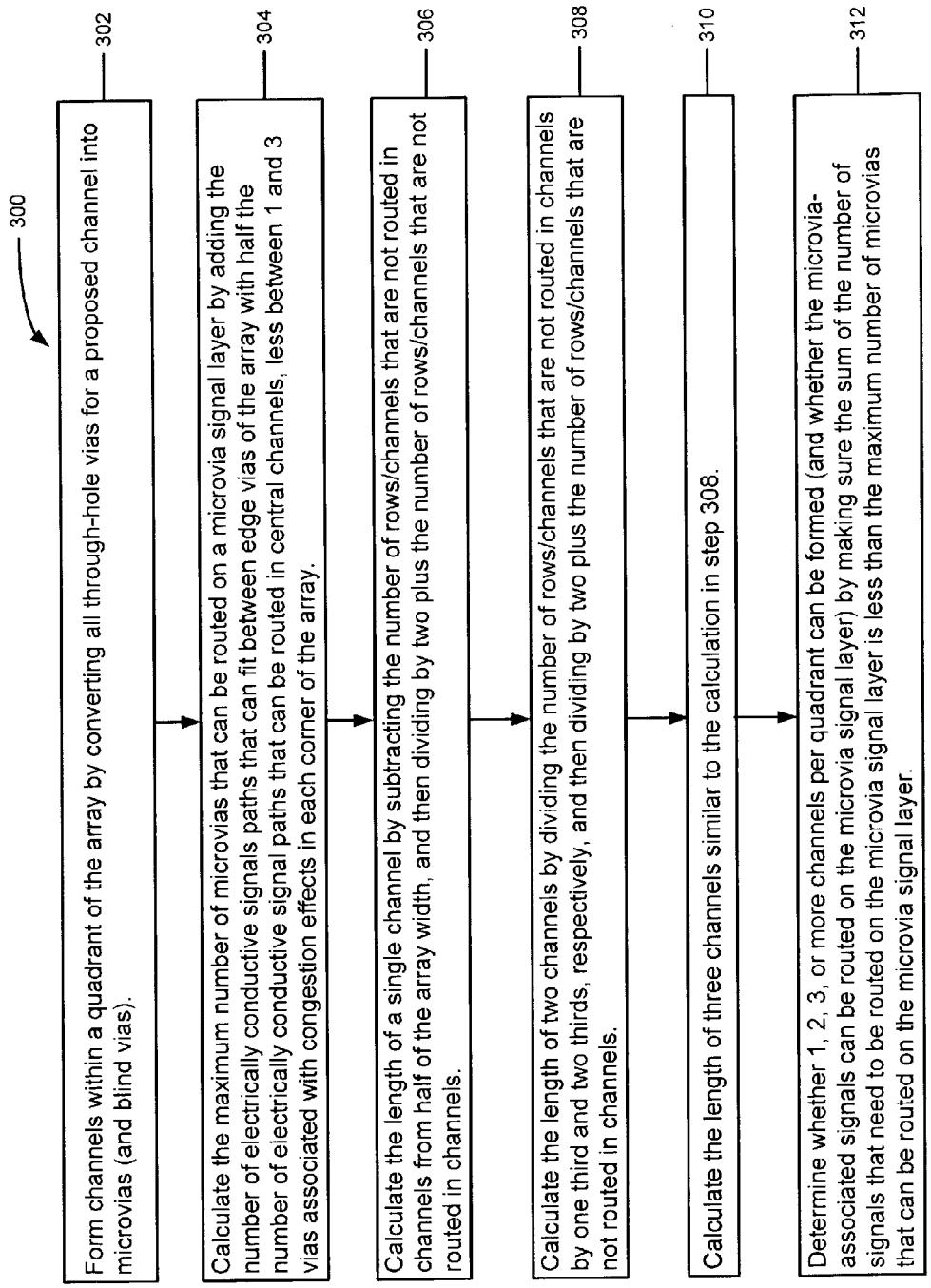
FIG. 4 shows a flowchart detailing an algorithm for calculating an optimum number of channels to form in the multilayer signal routing device shown in FIG. 1.

Referring to FIG. 4, there is shown a flowchart 300 detailing an algorithm for calculating an optimum number of channels to form in the multilayer signal routing device 10 shown in FIG. 1. In step 302, channels 104 may be formed within the quadrant of electrically conductive contacts 102 by converting all through-hole vias (e.g., supervias 20 and 22) for a proposed channel 104 into microvias (and blind vias). The signals associated with these microvias must therefore all be routed on a microvia signal layer (e.g., signal layer 16a). In step 304, the maximum number of microvias that can be routed on a microvia signal layer may be calculated by adding the number of electrically conductive signal paths that can fit between edge vias of the array with half the number of electrically conductive signal paths that can be routed in center channels (e.g., channels 104b), less between 1 and 3 vias associated with congestion effects in each corner of the array. In step 306, the length of a single channel 104 may be calculated by subtracting the number of outermost rows/columns that are not routed in channels (e.g., 3 in FIG. 2) from half of the array width, and then dividing by two plus the number of outermost rows/columns that are not routed in channels (e.g., 3 in FIG. 2). In step 308, the length of two channels 104 may be calculated by dividing the number of outermost rows/columns that are not routed in channels (e.g., 3 in FIG. 2) by one third and two thirds, respectively, and then dividing by two plus the number of outermost rows/columns that are not routed in channels (e.g., 3 in FIG. 2). In step 310, the length of three channels may be calculated similar to the calculation in step 308. In step 312, the number of channels that can be formed in the quadrant (e.g., 1, 2, 3, or more channels per quadrant) and the number of microvia-associated signals that can be routed on the microvia signal layer may be determined by making sure the sum of the number of signals that need to be routed on the microvia signal layer is less than the maximum number of microvias that can be routed on the microvia signal layer.

An example of the above-described algorithm of FIG. 4 may be provided. That is, assuming that all through-hole vias that are converted into microvias (and blind vias) need to be routed on a microvia signal layer, the total number of microvias that may be formed per quadrant can be calculated as follows:

$$T \cong n*(((A/2)-1)+((B/2)-1)-2+2.5+2.5) = n*((A+B)/2+1)$$

wherein T represents the total number of microvias per quadrant, A is equal to the number of electrically conductive contacts 102 in the X dimension (i.e., rows) of the full array, B is equal to the number of electrically conductive contacts 102 in the Y dimension (i.e., columns) of the full array, and n is equal to the number of electrically conductive signal paths that may be formed between electrically conductive contacts 102. The (−2), (+2.5), and (+2.5) terms in the above equation represent array corner congestion and center channel constants, which indicate that 2 vias are lost due to an array corner but 2.5 vias are gained each way because of a center channel (e.g., channels 104b).

Assuming a 1 mm spacing between the electrically conductive contacts 102 in the array and one complete evenly weighted channel, R vias need to be converted as follows:

$$R \cong 0.62*(A+B)/2-2$$

In this case, the channel always fits.

Assuming a 1 mm spacing between the electrically conductive contacts 102 in the array and two complete evenly weighted channels, R vias need to be converted as follows:

$$R \cong (0.7+0.4)*(A+B)/2-4$$

In this case, the two channels fit if 0.1*(A+B)/2<5 (i.e., if (A+B)<100).

Assuming a 1 mm spacing between the electrically conductive contacts 102 in the array and three complete evenly weighted channels, R vias need to be converted as follows:

$$R \cong (0.8+0.65+0.4)*(A+B)/2-6$$

In this case, the three channels fit if 0.85*(A+B)/2<7 (i.e., if (A+B)<16).

The above calculation will need to be adjusted for other pitch arrays, if interior channels need not be complete (i.e., allows for shorter channels), or if differential signals need to be routed together (i.e., need more breakouts per channel).

Figure 5:
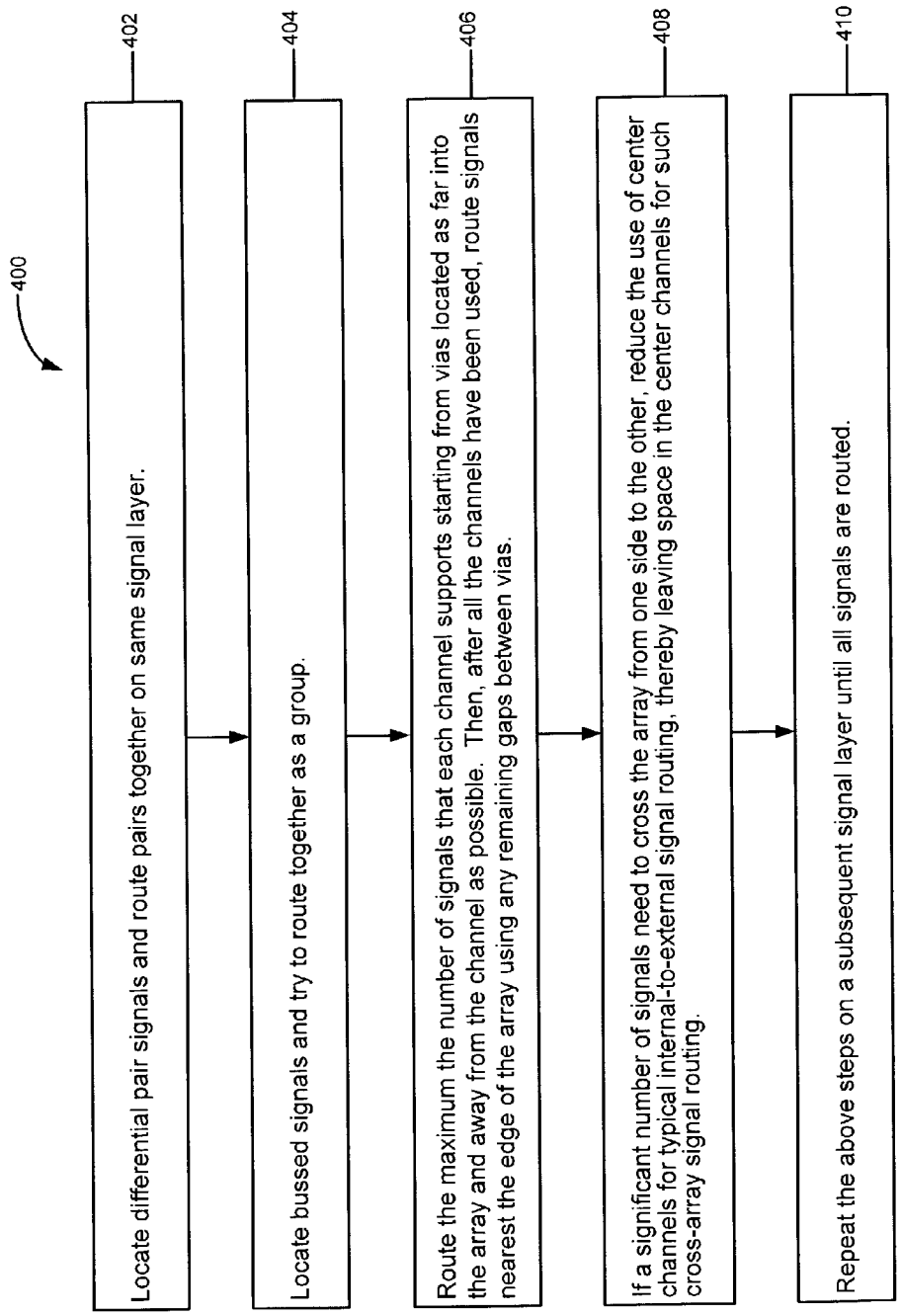
FIG. 5 shows a flowchart detailing an algorithm for routing signals both within and without channels on signals layers in the multilayer signal routing device shown in FIG. 1.

Referring to FIG. 5, there is shown a flowchart 400 detailing an algorithm for routing signals both within and without channels 104 on other signals layers (e.g., signal layers 16b, 16c, and 16d) in the multilayer signal routing device 10 shown in FIG. 1. In step 402, differential pair signals need to be located and then routed together on the same signal layer. In step 404, bussed signals need to be located and should be routed together as a group. This makes subsequent signal routing more efficient. In step 406, the maximum number of signals that each channel 104 supports are routed starting from vias located as far into the array and away from the channel 104 as possible. Then, after all the channels 104 have been used, signals nearest the edge of the array are routed using any remaining gaps between vias. In step 408, if a significant number of signals need to cross the array from one side to the other, the use of center channels (e.g., channels 104b) for typical internal-to-external signal routing should be reduced, thereby leaving space in the center channels for such cross-array signal routing. Typically, the extent of this reduction depends on whether the array is associated with the largest electronic component that is mounted on the multilayer signal routing device 10, and whether an extra signal routing layer may be needed. In step 410, the above-described steps are repeated on a subsequent signal layer until all signals are routed.

Figure 6:
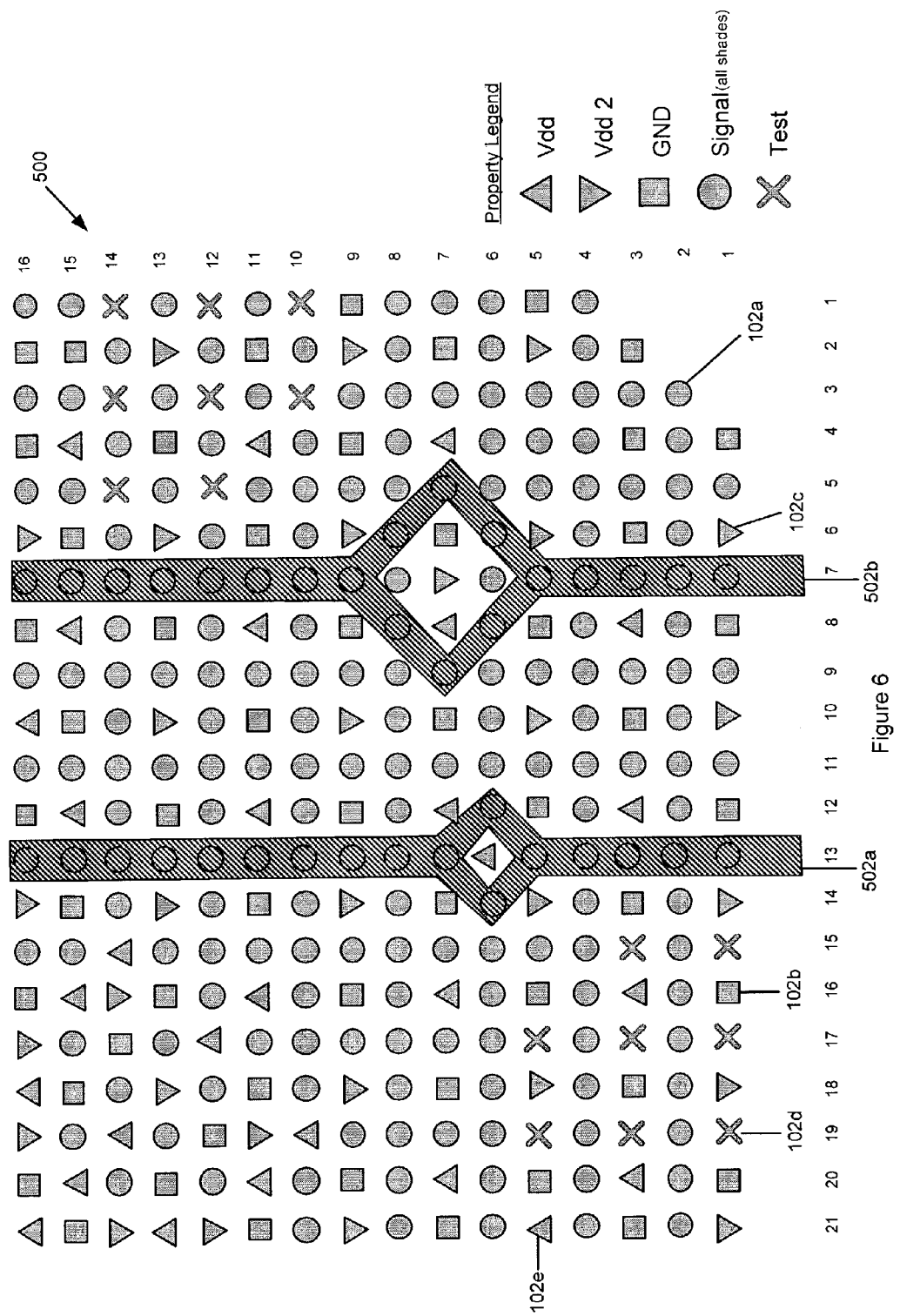
FIG. 6 shows another alternate embodiment of a portion of the primary layer of the multilayer signal routing device shown in FIG. 1.

Referring to FIG. 6, there is shown another alternate embodiment of a portion 500 of the primary layer 12 of the multilayer signal routing device 10 shown in FIG. 1. The alternate embodiment portion 500 shown in FIG. 6 is identical to the portion 100 shown in FIG. 2, except that two electrically conductive contacts 102 have different electrical properties and channels 502 are formed in different locations having different shapes. More specifically, the channels 502 have diamond shapes to route around both sides of the electrically conductive contacts 102 (and corresponding vias) that have been changed to have Power (Vdd, Vdd2) electrical properties. The diamond-shaped channels 502 are useful for routing around electrically conductive contacts 102 (and corresponding vias) having Power (Vdd, Vdd2) and Ground (GND) electrical properties since electrically conductive contacts 102 having these electrical properties typically also have through-hole vias, which may otherwise block channels formed on signal layers (e.g., signal layers 16b, 16c, and 16d).

Figure 7:
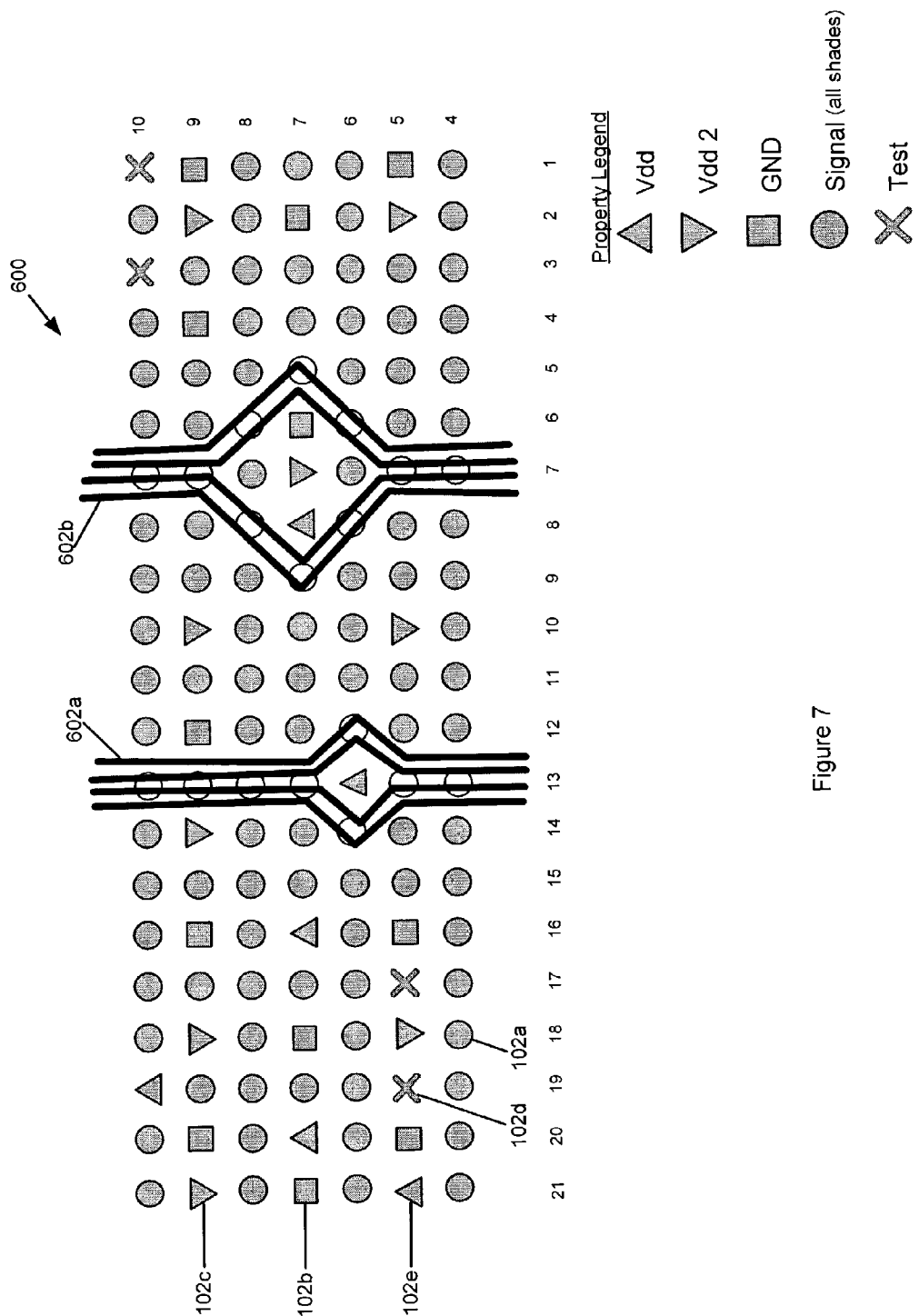
FIG. 7 shows a portion of the portion shown in FIG. 6, wherein electrically conductive signal paths are shown formed in channels that are shown in FIG. 6.

Referring to FIG. 7, there is shown a portion 600 of the portion 500 shown in FIG. 6, wherein electrically conductive signal paths 602 are shown formed in the channels 502 that are shown in FIG. 6. It should be noted that the non-shaded electrically conductive contacts 102 indicate where the channels 502 are formed on inner signal layers (e.g., signal layers 16b, 16c, and 16d) of the multilayer signal routing device 10 shown in FIG. 1.

As shown in FIG. 7, four electrically conductive signal paths 602 are shown formed in each of the channels 502 that are shown in FIG. 6. Each of these two groups of four electrically conductive signal paths 602 are split into two groups of two electrically conductive signal paths 602 in the diamond-shaped areas of the channels 502 that are shown in FIG. 6. While this is useful for routing around electrically conductive contacts 102 (and corresponding vias) having Power (Vdd, Vdd2) and Ground (GND) electrical properties as described above, the full routing capabilities of the channels 502 are not being utilized. That is, the channels 502 that are shown in FIG. 6 may accommodate at least five electrically conductive signal paths in non-diamond-shaped areas thereof. To accommodate at least one additional electrically conductive signal path in each of the channels 502 that are shown in FIG. 6, some electrically conductive contacts 102 (and corresponding vias) may be shifted in location to allow more than two electrically conductive signal paths 602 to be formed in one branch of the diamond-shaped areas of the channels 502 that are shown in FIG. 6.

Figure 8:
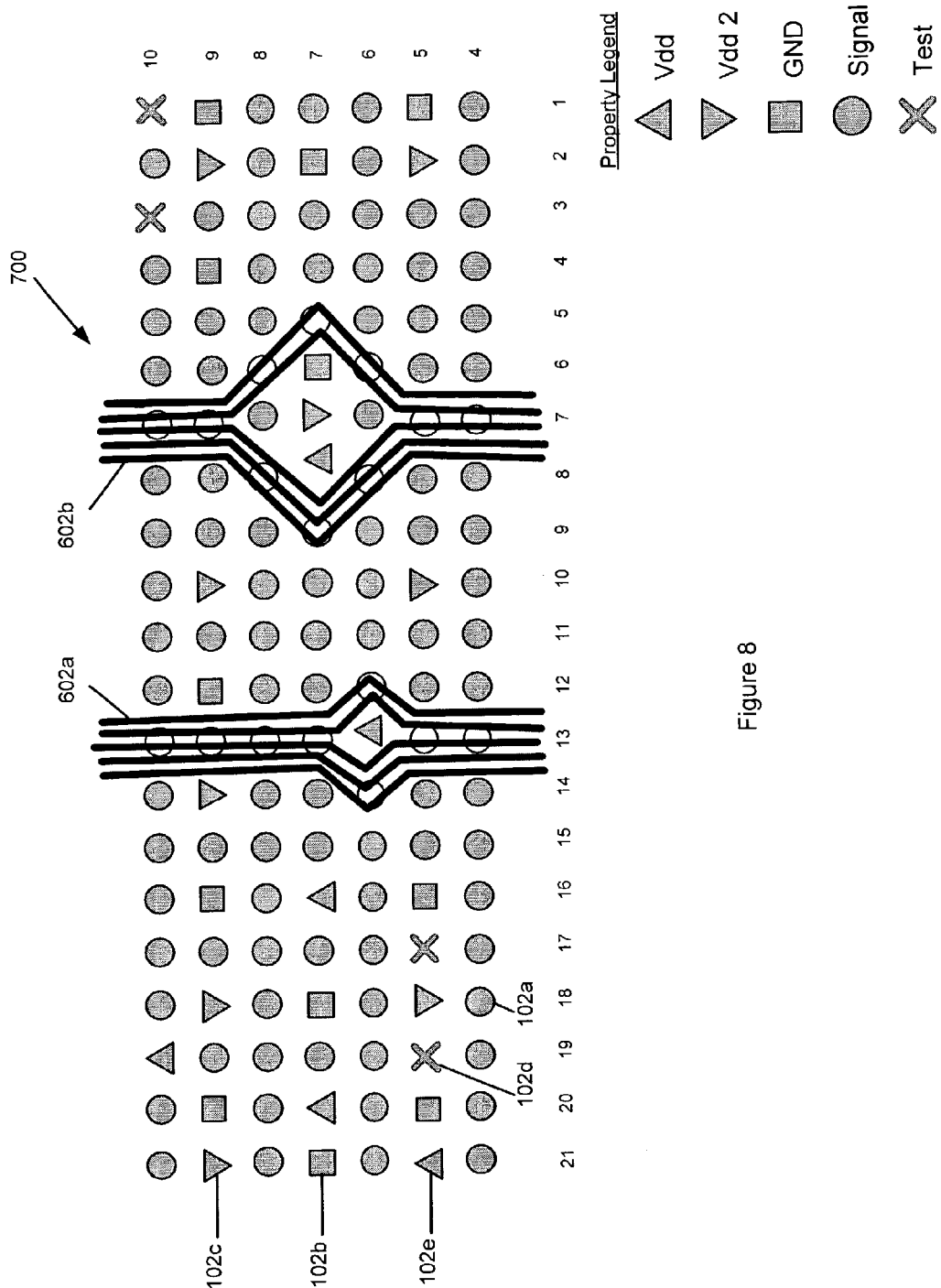
FIG. 8 shows an alternate embodiment portion of the portion shown in FIG. 6, wherein some electrically conductive contacts are shifted in location.

For example, referring to FIG. 8, there is shown an alternate embodiment portion 700 of the portion 500 shown in FIG. 6, wherein some electrically conductive contacts 102 (i.e., those within the diamond-shaped area of the channels 502) are shifted in location to allow more than two electrically conductive signal paths 602 to be formed in one branch of the diamond-shaped areas of the channels 502 that are shown in FIG. 6. The shifting of the locations of the electrically conductive contacts 102 (and corresponding vias) may be accomplished using the power/ground-based techniques and/or dog-bone techniques as described in the above-referenced related patent applications.

Figure 9:
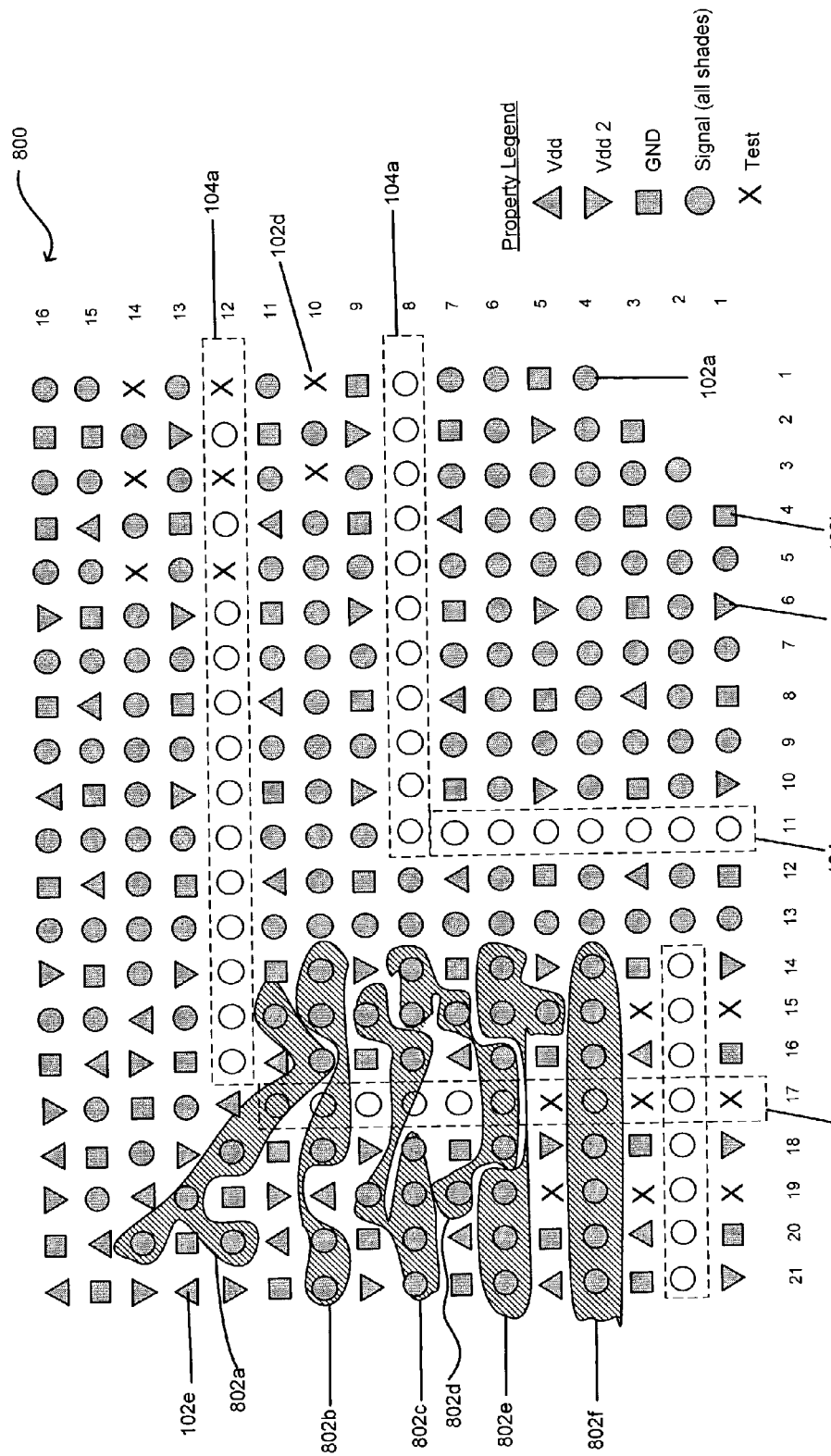
FIG. 9 shows another alternate embodiment of a portion of the primary layer of the multilayer signal routing device shown in FIG. 1.

Referring to FIG. 9, there is shown another alternate embodiment of a portion 800 of the primary layer 12 of the multilayer signal routing device 10 shown in FIG. 1. The alternate embodiment portion 800 shown in FIG. 9 is identical to the portion 100 shown in FIG. 2, except that the center channels 104b are removed and groups 802 of electrically conductive contacts 102 having the Signal electrical property are formed. Expanding on step 406 of the algorithm 400 of FIG. 5, the groups 802 of electrically conductive contacts 102 are formed such that they are paired together when routing signals using channels 104 and routing signals using gaps remaining between the outermost vias. That is, when routing signals on inner signal layers (e.g., signal layers 16b, 16c, and 16d) of the multilayer signal routing device 10 shown in FIG. 1, the default method is to route the maximum number of signals that each channel 104 supports starting from vias located as far into the array and away from the channel 104 as possible. Then, after all the channels 104 have been used, signals nearest the edge of the array are routed using any remaining gaps between the outermost vias. For example, referring to FIG. 9, on a first inner signal layer (e.g., signal layers 16b) of the multilayer signal routing device 10 shown in FIG. 1, signals associated with electrically conductive contacts 102 in group 802a are first routed using the channel 104a formed in column 17, rows 1–11, and then signals associated with electrically conductive contacts 102 in group 802f are routed using any remaining gaps between the outermost vias. On a next first inner signal layer (e.g., signal layers 16c) of the multilayer signal routing device 10 shown in FIG. 1, signals associated with electrically conductive contacts 102 in group 802b are first routed using the channel 104a formed in column 17, rows 1–11, and then signals associated with electrically conductive contacts 102 in group 802e are routed using any remaining gaps between the outermost vias. This process continues and works well until the last inner signal layer when the proximity of the two groups (e.g., groups 802c and 802d) can cause blocking.

To alleviate the above problem, the same groups are considered, but the pairings are switched. For example, referring to FIG. 9, on a first inner signal layer (e.g., signal layers 16b) of the multilayer signal routing device 10 shown in FIG. 1, signals associated with electrically conductive contacts 102 in group 802a are first routed using the channel 104a formed in column 17, rows 1–11, and then signals associated with electrically conductive contacts 102 in group 802d are routed using any remaining gaps between the outermost vias. On a next first inner signal layer (e.g., signal layers 16c) of the multilayer signal routing device 10 shown in FIG. 1, signals associated with electrically conductive contacts 102 in group 802b are first routed using the channel 104a formed in column 17, rows 1–11, and then signals associated with electrically conductive contacts 102 in group 802e are routed using any remaining gaps between the outermost vias. This process continues and works well through the last inner signal layer because the last two groups (e.g., groups 802c and 802f) are not proximate each other and thus do not cause blocking.

Figure 10:
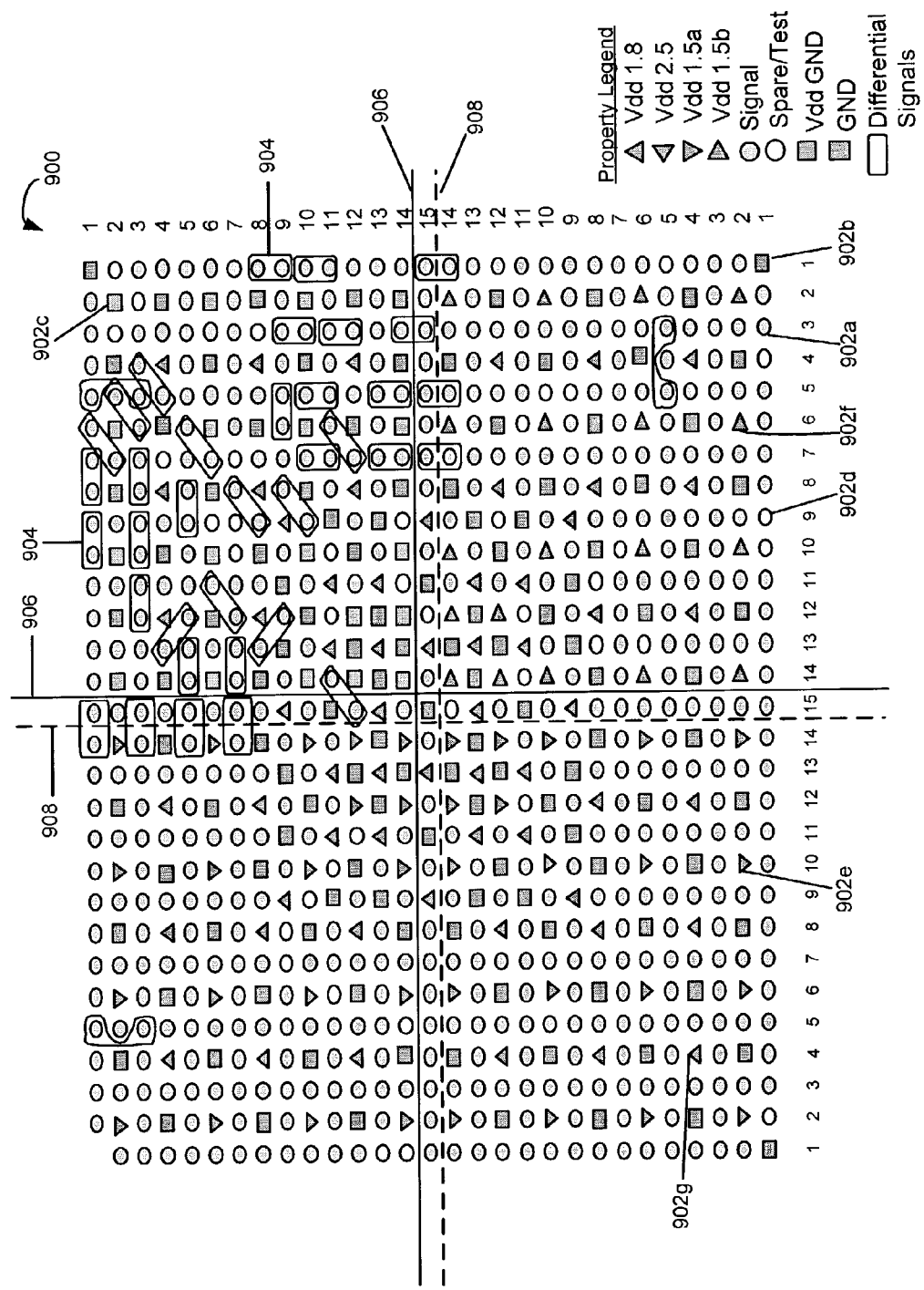
FIG. 10 shows an alternate embodiment of a portion of the primary layer of the multilayer signal routing device shown in FIG. 1.

Referring to FIG. 10, there is shown an alternate embodiment of a portion 900 of the primary layer 12 of the multilayer signal routing device 10 shown in FIG. 1. The alternate embodiment portion 900 shown in FIG. 10 corresponds to a portion of the primary layer 12 of the multilayer signal routing device 10 where an electronic component having a surface mount grid array package with 840 (i.e., a 29×29 array) electrically conductive contacts may be mounted on the primary layer 12 of the multilayer signal routing device 10. Thus, the portion 900 comprises 840 (i.e., also a 29×29 array) electrically conductive contacts 902 for mating with the 840 electrically conductive contacts of the surface mount grid array package of the electronic component that may be mounted on the primary layer 12 of the multilayer signal routing device 10. Of course, it is within the scope of the present invention that the 840 electrically conductive contacts 902 may mate with 840 corresponding electrically conductive contacts of multiple surface mount grid array packages of multiple electronic components (or multichip modules or hybrid modules having multiple electronic components of like or differing kind) that may be mounted on the primary layer 12 of the multilayer signal routing device 10.

As shown in FIG. 10, each of the electrically conductive contacts 902 may have one of several different types of electrical properties (e.g., Signal, Ground (GND, Vdd GND), Power (Vdd 1.8, Vdd 2.5, Vdd 1.5a, Vdd 1.5b), or Spare/Test), as defined in the electrical property legend. As also shown in FIG. 10, some of the electrically conductive contacts 902 having the Signal electrical property are grouped together as differential signal pairs 904. Because of these differential signal pair groupings 904, center channels in the array of 840 electrically conductive contacts 902 should be formed in carefully chosen areas.

Figure 11:
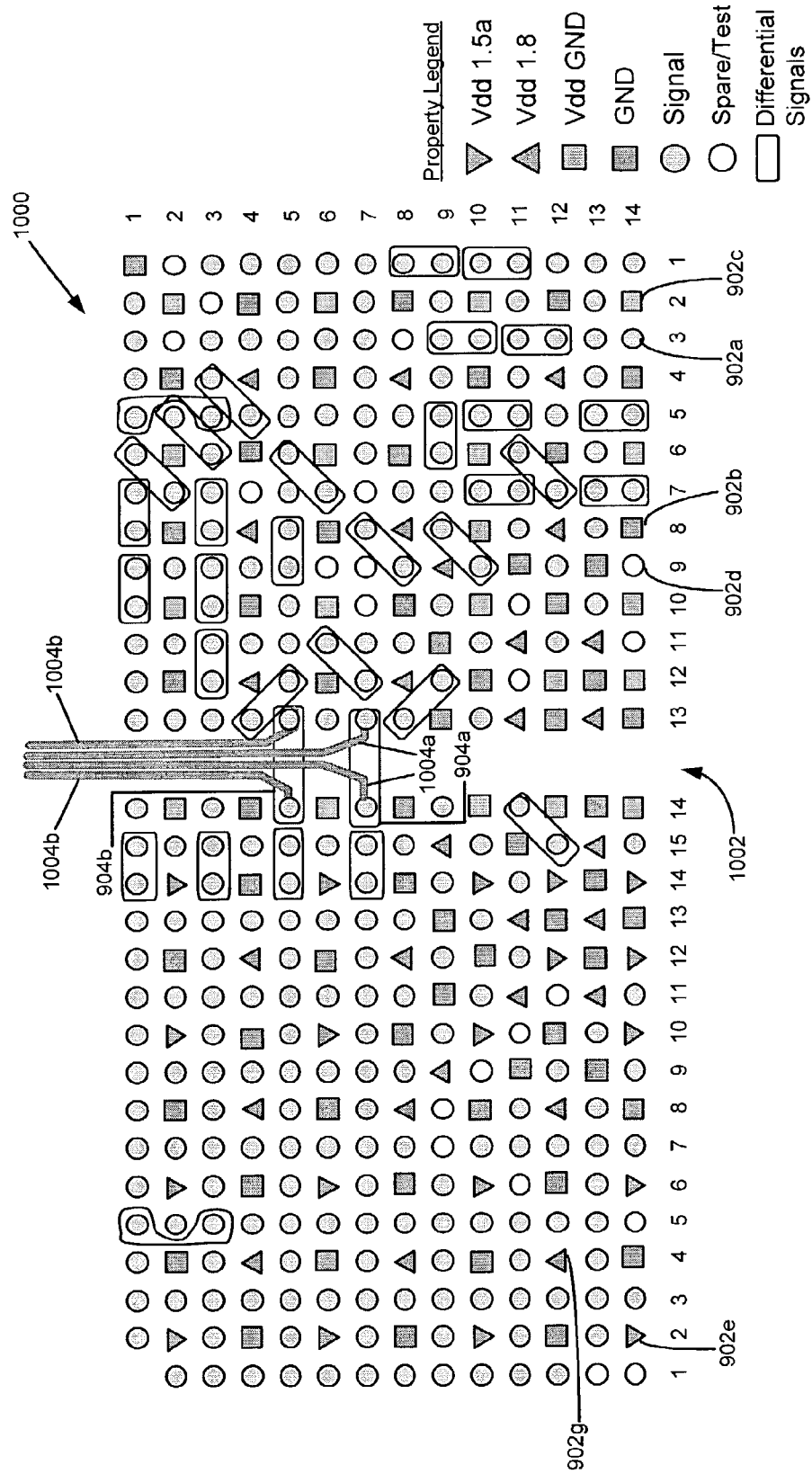
FIG. 11 shows a portion (i.e., the upper half portion) of the portion shown in FIG. 10, wherein a center channel is formed in a poorly chosen area.

Referring to FIG. 11, a problem that can occur if center channels in the array of 840 electrically conductive contacts 902 are formed in areas not carefully chosen is illustrated. That is, FIG. 11 shows a portion 1000 (i.e., the upper half portion) of the portion 900 shown in FIG. 10, wherein a center channel 1002 is formed in a poorly chosen area. More specifically, the center channel 1002 is formed in an area (i.e., between columns 13 and 14 in the upper right quadrant) such that two differential signal pair groupings 904*a* and 904*b* span the center channel 1002. Thus, the center channel 1002 is formed in a poorly chosen area because electrically conductive signal paths 1004 routed to/from both of the two differential signal pair groupings 904*a* and 904*b* spanning the center channel 1002 cannot be routed together, as is generally preferred. Instead, as shown in FIG. 11, only the electrically conductive signal paths 1004*a* may be routed together to/from their respective differential signal pair grouping 904*a*, thereby separating the electrically conductive signal paths 1004*b* that are routed to/from their respective differential signal pair grouping 904*b*.

Referring again to FIG. 10, it is preferred to form center channels as close to the actual center of the array as possible so as to provide an even distribution of signals that are routed in a center channel from both sides of the center channel. To illustrate this concept, FIG. 10 shows both carefully and poorly chosen areas where center channels may be formed. For example, carefully chosen areas 906 for forming center channels are chosen based at least in part upon minimizing the number of differential signal pair groupings 904 that will span resulting center channels. As shown in FIG. 10, only one differential signal pair grouping 904 that will span resulting center channels based upon the carefully chosen areas 906. In contrast, poorly chosen areas 908 for forming center channels are typically chosen without regard for minimizing the number of differential signal pair groupings 904 that will span resulting center channels. As shown in FIG. 10, three or more differential signal pair groupings 904 will span resulting center channels based upon the poorly chosen areas 908.

At this point it should be noted that center channels may be formed and/or expanded in the array of 840 electrically conductive contacts 902 using the microvia-based techniques, power/ground-based techniques, and/or dog-bone techniques as described in the above-referenced related patent applications.

Figure 12:
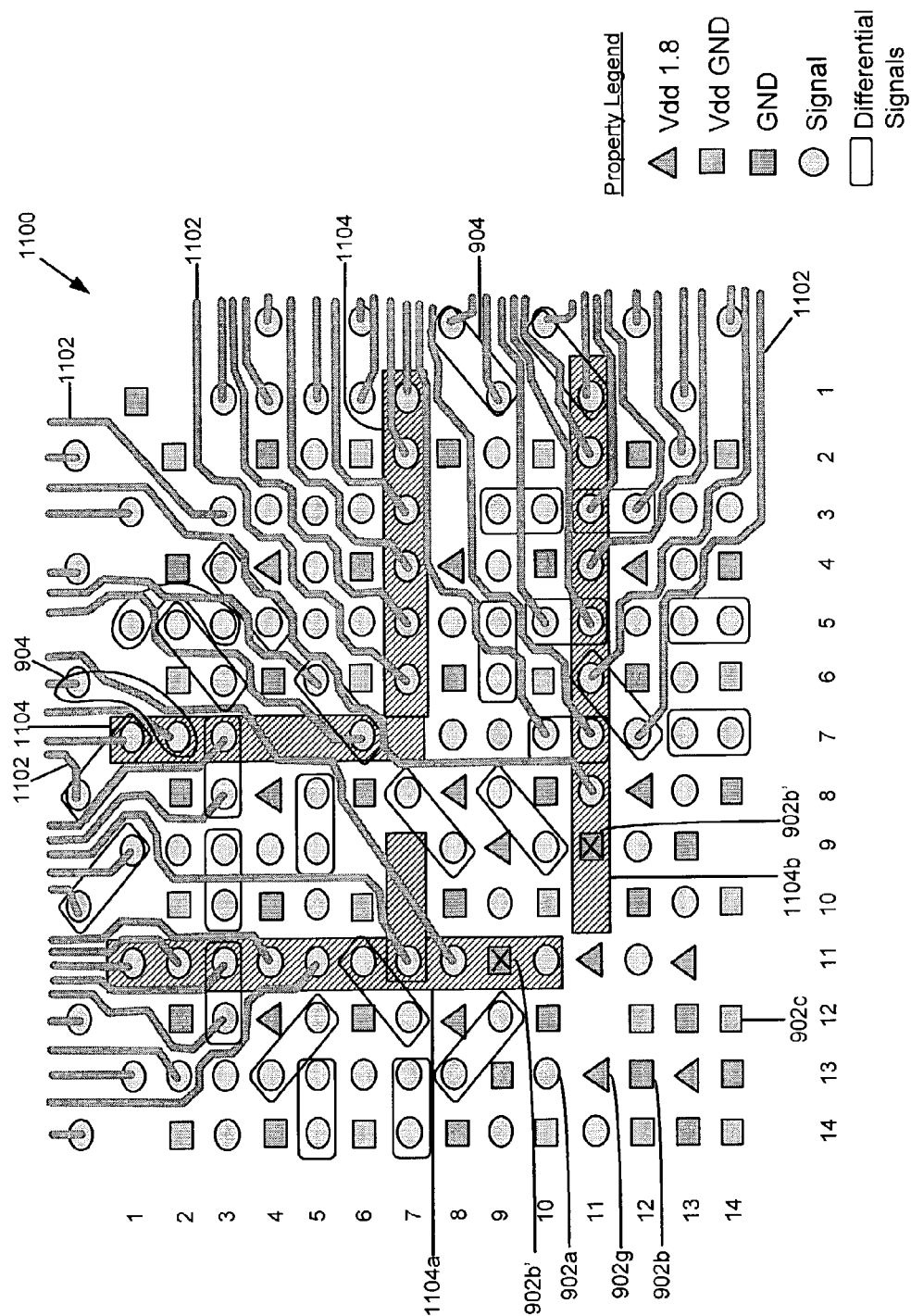
FIG. 12 shows a portion of an inner signal layer of the multilayer signal routing device shown in FIG. 1 corresponding to a portion (i.e., the upper right quadrant) of the portion shown in FIG. 10.

Referring to FIG. 12, there is shown a portion 1100 of an inner signal layer (e.g., signal layer 16*b*, 16*c*, or 16*d*) of the multilayer signal routing device 10 shown in FIG. 1 corresponding to a portion (i.e., the upper right quadrant) of the portion 900 shown in FIG. 10. As shown in FIG. 12, the electrically conductive contacts 902 along the outer edges of the array have been staggered so as to allow for enhanced signal routing to and from electrically conductive contacts 902 in the outer rows/columns of the array, as described above. As also shown in FIG. 12, a plurality of electrically conductive signal paths 1102 are formed on the portion 1100 of the inner signal layer for routing signals to and from selected ones of the electrically conductive contacts 902 within the array. Notice that differential signal pair groupings 904 are routed together, as is preferred.

As further shown in FIG. 12, channels 1104 are formed on the portion 1100 of the inner signal layer using the microvia-based techniques as described in the above-referenced related patent applications. In particular, FIG. 12 shows how some channels (i.e., channels 1104*a* and 1104*b*) may be extended by allowing selected electrically conductive contacts 902*b*' having the Ground (GND) electrical property to be converted into microvias. That is, electrically conductive contacts 902 having the Power (Vdd 1.8) and Ground (GND, Vdd GND) and electrical properties are typically associated with through-hole vias, and thereby cause channel blockages. However, as shown in FIG. 12, when selected electrically conductive contacts 902*b*' having the Ground (GND) electrical property are converted into microvias, channels (1104*a* and 1104*b*) may be extended on signal layers beneath a ground microvia layer. For example, referring back to FIG. 1, the selected electrically conductive contacts 902*b*' may correspond to the power/ground microvias 32, the ground microvia layer may correspond to power/ground layer 18*a*, and the inner signal layers may correspond to signal layers 16*a*, 16*b*, 16*c*, and 16*d*. Of course, other electrically conductive contacts having electrical properties that are typically associated with through-hole vias (e.g., electrically conductive contacts having the Ground (Vdd GND) and Power (Vdd 1.8, Vdd 2.5, Vdd 1.5a, and Vdd 1.5b) electrical properties) may also be converted into microvias so as to allow channels to be extended similar to above.

Figure 13:
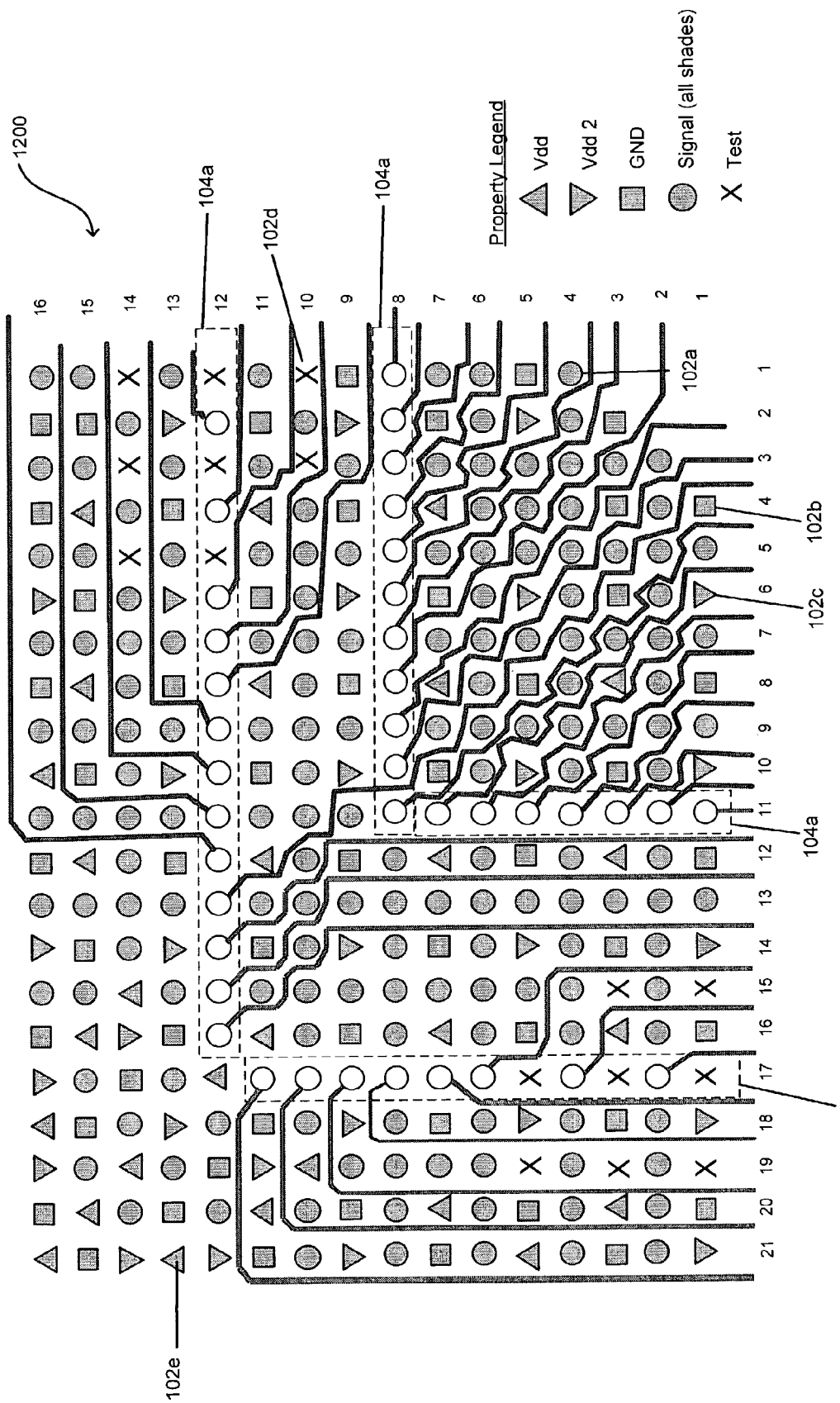
FIG. 13 shows another alternate embodiment of a portion of the primary layer of the multilayer signal routing device shown in FIG. 1.

Referring to FIG. 13, there is shown an alternate embodiment of a portion 1200 of the primary layer 12 of the multilayer signal routing device 10 shown in FIG. 1. The alternate embodiment portion 1200 shown in FIG. 13 is identical to the portion 100 shown in FIG. 2, except that the center channels 104*b* are removed and a portion (i.e., the non-shaded electrically conductive contacts 102) of the electrically conductive contacts 102 do not represent microvias. That is, the non-shaded electrically conductive contacts 102 represent electrically conductive pads that are formed only on the primary layer 12 of the multilayer signal routing device 10 and do not extend to other layers of the multilayer signal routing device 10. Thus, signals may be routed to/from these non-shaded electrically conductive contacts 102 only on the primary layer 12 of the multilayer signal routing device 10 via a plurality of electrically conductive signal paths 1202 formed on the primary layer 12 of the multilayer signal routing device 10.

Figure 14:
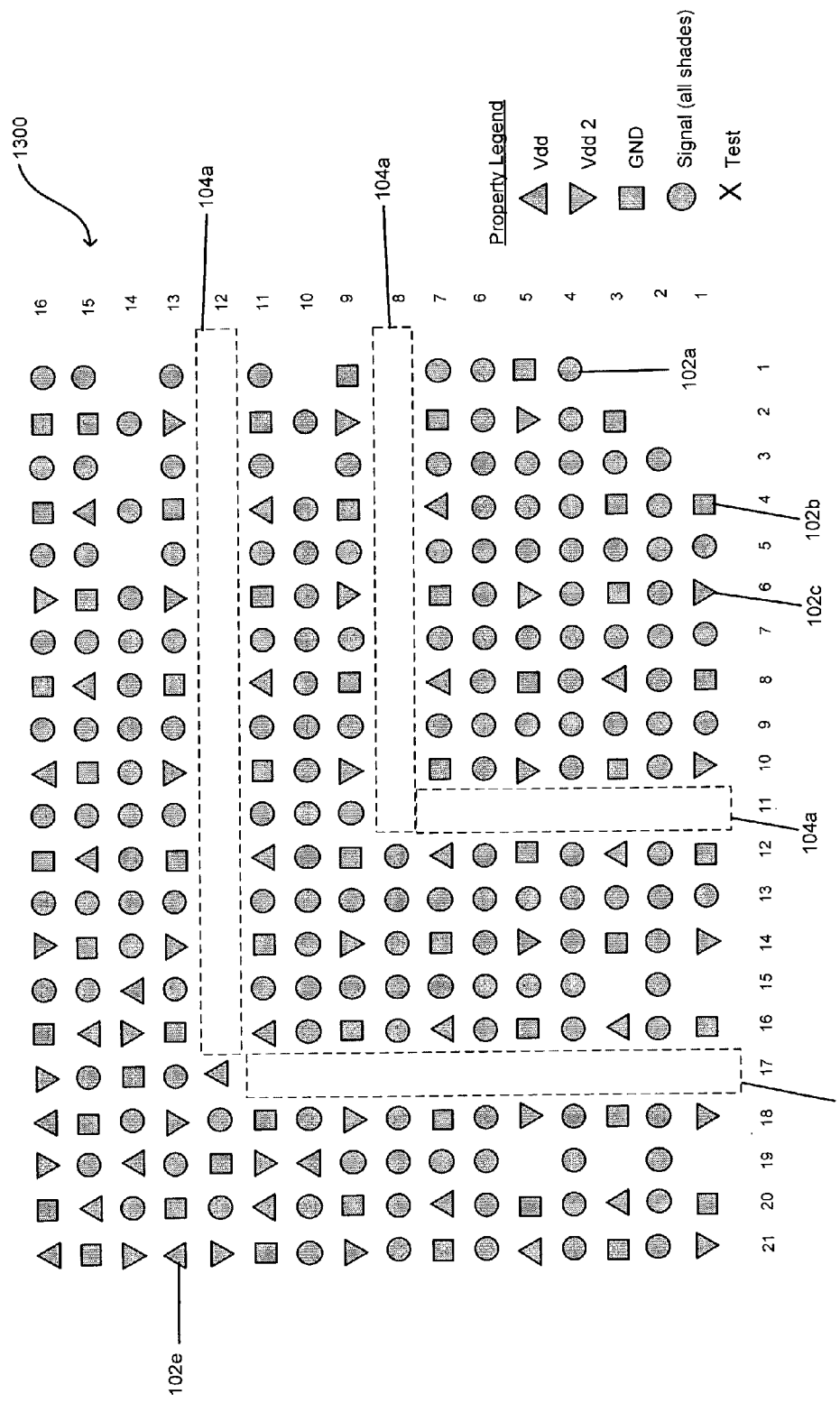
FIG. 14 shows an embodiment of a portion of one of the plurality of electrically conductive signal path layers of the multilayer signal routing device shown in FIG. 1, having channels formed therein.

The non-shaded electrically conductive contacts 102 are arranged so as to form channels 104*a* in other layers of the multilayer signal routing device 10. For example, as shown in FIG. 14, there is shown an embodiment of a portion 1300 of one of the plurality of electrically conductive signal path layers 16 of the multilayer signal routing device 10 shown in FIG. 1, having channels 104*a* formed therein. The channels 104*a* correspond to the locations of the non-shaded electrically conductive contacts 102 formed on the primary layer 12 of the multilayer signal routing device 10. Similar to the above-mentioned embodiments, the channels 104*a* may be used to route signals on other layers of the multilayer signal routing device 10.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

The invention claimed is:

1. A method for reducing the number of layers in a multilayer signal routing device, the multilayer signal routing device having a plurality of electrically conductive signal path layers for routing a plurality of electrical signals thereon, the method comprising:

forming a plurality of electrically conductive vias in the multilayer signal routing device for electrically connecting at least two of the plurality of electrically conductive signal path layers, the plurality of electrically conductive vias being arranged so as to form at least one channel in at least one other of the plurality of electrically conductive signal path layers, wherein the plurality of electrically conductive vias form a part of an array of a plurality of electrically conductive contacts, wherein the at least one channel is at least partially formed beneath at least some of the plurality of electrically conductive vias and traverses the array; and grouping at least a portion of the plurality of electrical signals based at least in part upon their proximity to the at least one channel so that they may be efficiently routed therein.

2. The method of claim 1, wherein the at least one channel corresponds in shape to the arrangement of the plurality of electrically conductive vias.

3. The method of claim 1, wherein the at least one other of the plurality of electrically conductive signal path layers is not located between the at least two electrically connected electrically conductive signal path layers.

4. The method of claim 1, wherein at least some of the plurality of electrically conductive contacts are respectively associated with at least some of the plurality of electrical signals, wherein electrical signals that are respectively associated with electrically conductive contacts located along a perimeter of the array are not routed in the at least one channel.

5. The method of claim 4, further comprising:

determining an optimum number of the at least one channel based upon at least one of: a number of electrically conductive signal paths that fit between electrically conductive contacts; a number of electrically conductive signal paths that fit within the at least one channel; a number of electrical signals that are respectively associated with electrically conductive contacts located along the perimeter of the array that are not routed in the at least one channel; and a number of electrically conductive contacts located along the perimeter of the array that are respectively associated with electrical signals that are not routed in the at least one channel.

6. The method of claim 4, further comprising:

further grouping at least a portion of the grouped plurality of electrical signals into subgroups based at least in part upon their proximity to the perimeter of the array.

7. The method of claim 6, further comprising:

routing the subgroups of electrical signals located furthest from the perimeter of the array in the at least one channel.

8. The method of claim 7, further comprising:

routing the subgroups of electrical signals located closest to the perimeter of the array in the at least one channel only after the subgroups of electrical signals located furthest from the perimeter of the array have been routed.

9. The method of claim 6, further comprising:

routing the subgroups of electrical signals located closest to the perimeter of the array outside the at least one channel.

10. The method of claim 6, further comprising:

pairing the subgroups of electrical signals located closer to the perimeter of the array with the subgroups of electrical signals located further from the perimeter of the array so as to improve routing efficiency.

11. The method of claim 4, wherein the at least one channel is at least partially substantially diamond-shaped so as to allow electrical signals to be routed around electrically conductive contacts disposed within a center portion of the diamond shape.

12. The method of claim 11, further comprising:

shifting the locations of the electrically conductive contacts disposed within the center portion of the diamond shape so as to allow additional electrical signals to be routed around the electrically conductive contacts disposed within the center portion of the diamond shape.

13. The method of claim 4, wherein the at least one channel includes a center channel formed substantially through a center of the array.

14. The method of claim 13, wherein the center channel is located substantially through the center of the array based upon at least one of: a number of electrical signals identified as differential signal pairs that may span the center channel; even distribution of electrical signal routing within the center channel; even distribution of electrical signal routing within others of the at least one channel; even distribution of electrical signal routing outside the center channel; and even distribution of electrical signal routing outside others of the at least one channel.

15. The method of claim 4, further comprising:

forming a separate channel substantially through a center of the array, wherein the separate channel is located substantially through the center of the array based upon at least one of: a number of electrical signals identified as differential signal pairs that may span the separate channel; even distribution of electrical signal routing within the separate channel; even distribution of electrical signal routing within the at least one channel; even distribution of electrical signal routing outside the separate channel; and even distribution of electrical signal routing outside the at least one channel.

16. The method of claim 1, further comprising:

forming at least one additional electrically conductive via in the multilayer signal routing device for electrically connecting at least two power/ground layers of the multilayer signal routing device, the at least one additional electrically conductive via being arranged so as to form at least one additional channel in at least one other of the plurality of electrically conductive signal path layers.

17. The method of claim 1, further comprising:

forming at least one additional electrically conductive via in the multilayer signal routing device for electrically connecting at least two power/ground layers of the multilayer signal routing device, the at least one additional electrically conductive via being arranged so as to extend the at least one channel in at least one other of the plurality of electrically conductive signal path layers.

18. The method of claim 1, wherein at least three of the plurality of electrically conductive vias are arranged to form each of the at least one channel.

19. A method for reducing the number of layers in a multilayer signal routing device, the multilayer signal routing device having a plurality of electrically conductive signal path layers for routing a plurality of electrical signals thereon, the method comprising:

forming a plurality of electrically conductive contacts on a first of the plurality of electrically conductive signal path layers, at least a portion of the plurality of electrically conductive contacts being arranged so as to form at least one channel in at least one other of the plurality of electrically conductive signal path layers, wherein the plurality of electrically conductive contacts form an array of electrically conductive contacts, wherein the at least one channel is at least partially formed beneath at least some of the plurality of electrically conductive contacts and traverses the array; and routing at least a portion of the plurality of electrical signals to or from at least some of the arranged plurality of electrically conductive contacts on the first of the plurality of electrically conductive signal path layers.

20. The method of claim 19, wherein at least three of the arranged plurality of electrically conductive contacts are arranged to form each of the at least one channel.

* * * * *